United States Patent
Ali et al.

(10) Patent No.: US 9,442,840 B2
(45) Date of Patent: Sep. 13, 2016

(54) VIRTUAL BOUNDARY CODES IN A DATA IMAGE OF A READ-WRITE MEMORY DEVICE

(71) Applicant: QUALCOMM Incorporated, San Diego, CA (US)

(72) Inventors: Dhamim Packer Ali, San Diego, CA (US); Benish Babu, San Diego, CA (US); Taara Nandakishore Ellala, Hyderabad (IN); Ashwani Kumar, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 330 days.

(21) Appl. No.: 13/720,532

(22) Filed: Dec. 19, 2012

(65) Prior Publication Data

US 2014/0173179 A1  Jun. 19, 2014

(51) Int. Cl.
G06F 12/02 (2006.01)
G06F 3/06 (2006.01)
G11C 29/00 (2006.01)

(52) U.S. Cl.
CPC .......... *G06F 12/0246* (2013.01); *G06F 3/064* (2013.01); *G06F 3/0619* (2013.01); *G06F 3/0679* (2013.01); *G06F 3/0688* (2013.01); *G06F 2212/7202* (2013.01); *G11C 29/82* (2013.01)

(58) Field of Classification Search
None
See application file for complete search history.

(56) References Cited

U.S. PATENT DOCUMENTS

| | | | |
|---|---|---|---|
| 4,611,272 A | 9/1986 | Lomet | |
| 7,313,648 B2 * | 12/2007 | Lloyd | 711/103 |
| 7,404,031 B2 * | 7/2008 | Oshima | G06F 12/0246 235/492 |
| 7,434,122 B2 | 10/2008 | Jo | |
| 7,454,673 B2 | 11/2008 | Packer Ali et al. | |
| 7,900,032 B2 | 3/2011 | Rodgers et al. | |
| 2007/0050675 A1 | 3/2007 | Yu | |
| 2008/0270730 A1 | 10/2008 | Lasser et al. | |
| 2008/0313452 A1 | 12/2008 | Qin et al. | |
| 2011/0066837 A1 | 3/2011 | Lee et al. | |
| 2011/0238971 A1 | 9/2011 | Heo et al. | |
| 2012/0017071 A1 * | 1/2012 | Shahar et al. | 713/2 |
| 2012/0030691 A1 | 2/2012 | Miranda | |
| 2012/0047323 A1 | 2/2012 | Sareen et al. | |
| 2013/0246891 A1 * | 9/2013 | Manning et al. | 714/773 |
| 2014/0173187 A1 | 6/2014 | Ali et al. | |

FOREIGN PATENT DOCUMENTS

KR 20060014320 A  2/2006
WO WO-2006009322 A2  1/2006

OTHER PUBLICATIONS

International Search Report and Written Opinion—PCT/US2013/068939—ISA/EPO—Mar. 5, 2014

* cited by examiner

*Primary Examiner* — Prasith Thammavong
*Assistant Examiner* — Tracy Chan
(74) *Attorney, Agent, or Firm* — Nicholas A. Cole

(57) ABSTRACT

Methods, systems and devices are provided for configuring a read-write memory device with a data image. The method includes determining a data image distribution based on a virtual block size of a series of virtual blocks designated for the read-write memory device. The data image is divided into one or more data image portions, wherein a virtual boundary code is appended to at least one of the data image portions. The data image portions are stored in respective virtual blocks of the series of virtual blocks, skipping over any bad block within the read-write memory device, even between the virtual blocks.

68 Claims, 10 Drawing Sheets

VIRTUAL BOUNDARY CODES IN A DATA IMAGE OF A READ-WRITE MEMORY DEVICE

BACKGROUND

Flash memory is a non-volatile computer storage chip that can be electrically erased and reprogrammed. NAND flash memory (also referred to as just NAND memory) is a high density type of read-write memory that may be programmed and read in blocks or pages. NAND memory is used in memory cards, USB flash drives, solid-state drives, and similar products, for general storage and transfer of data, as well as being used to store configuration data in numerous digital devices.

Read-only memory (ROM) is a class of storage medium used in computers and other electronic devices. Traditional ROM is read-only memory and cannot be modified, or can be modified only slowly or with difficulty, so it is mainly used to distribute firmware. Firmware refers to software specifically designed for particular hardware. Changing the firmware of a device may rarely or never be done during its economic lifetime. Common reasons for updating firmware include fixing bugs or adding features to the hardware for which it is used. One way to update firmware is to reprogram with a special procedure flash memory used with the ROM. Unlike ROM, NAND memory can be erased and re-programmed multiple times.

NAND memory is typically organized in a number of blocks and each block consists of a number of pages. When the length of an actual page or block of NAND memory is set by a manufacturer, it is permanently fixed at that length. A "block" as it relates to computer memory, and particularly NAND memory, comprises a sequence of storage bytes or bits, having a nominal length. That length is referred to as the block size. The process of storing data into blocks is normally accomplished a whole page at a time, while erasing data is done in units of blocks.

Each block may also be organized into a number of pages, which are typically 2,048 bytes (~2 KB) or 4,096 bytes (~4 KB) in size. Associated with at least one page of each block are a few bytes (typically 1/32 of the data size) that can be used for storage of an error correcting code (ECC) checksum. Typical block sizes include:

64 pages, each having 2,048 bytes (~2 KB) and a spare region of 64 bytes, which means a block size of 128 KB (for page data) and 4 KB (for spare data such as error correction codes, bad block information, metadata, etc.);

64 pages, each having 4,096 bytes (~4 KB) and a spare region of 128 bytes, which means a block size of 256 KB for page data; and 128 pages, each having 2,048 bytes (~2 KB) and a spare region of 128 bytes, means a block size of 256 KB for page data.

Manufacturing defects often occur in the fabrication of NAND memories, which can render some memory cells non-functional and unusable. Those blocks including a defective memory cell or cells are referred to as "bad blocks." Due to manufacturing processes, many NAND devices are shipped from the factory with some bad blocks. For example, by allowing some bad blocks, the manufacturers achieve far higher yields than would be possible if all blocks had to be verified good. This significantly reduces NAND flash costs and only slightly decreases the storage capacity of the parts. Nonetheless, manufactures of NAND memory generally guarantee that the initial block (Block 0) is good, but the remaining data blocks are not guaranteed.

Some bad block management schemes place information on the NAND memory identifying bad blocks on the chip. Such bad block information may include a list indicating either the good blocks which store the image to be accessed or the bad blocks to be skipped. However, variables in the characteristics of the NAND memory itself, as well as reseller and/or manufacturer specific bad block detection schemes/formats too often require customized NAND memory handling and programming.

Additionally, ROM firmware design in computing devices is somewhat restrained compared to software because these routines cannot be practically rewritten later in the development cycle and are generally permanently set once the computing device is manufactured. Consequently, flash memory is used to run boot loader routines since all or part of the data image on a flash memory can be rewritten and thus updated. As used herein, the term "data image" refers to the information stored in one or more memory cells of a read-write memory device, such as a NAND memory device. The data images run off flash memory for contemporary boot loaders tend to be complicated, since they try to accommodate NAND device-specific characteristics, which as noted above vary greatly among resellers and manufacturers.

SUMMARY

The various embodiments include a storing a data image on a read-write memory, such as flash memory, that accommodates bad blocks and enables computing devices to skip bad blocks when reading from the memory using a single algorithm regardless of the memory manufacturer. The method includes configuring the data image to be stored in the read-write memory with codes or special values at boundaries of good blocks of data. Such codes or special values are referred to herein as "virtual boundary codes," which when recognized by the computing device indicates that the identified block contains valid data. The data image may be stored in the memory in one or more virtual blocks having a virtual block size corresponding to a virtual block boundary indicating the start or end of a virtual block. The size of each virtual block may be smaller than or equal to the actual block size for the NAND device. The virtual block size may be set as the lowest common actual block size expected to be supported by the product. A system for storing a data image on the NAND memory uses the memory manufacturer's defined algorithm for identifying bad blocks, and then stores the data image in good blocks while skipping bad blocks. The virtual boundary codes are included at the virtual block boundaries of each good block used to store the data image. The data image thus includes virtual boundary codes that a computing device can look for to identify blocks of data to be read when accessing the read-write memory without having to follow reseller-specific parameters in order to identify good or bad blocks in the memory chip.

Another aspect includes a method of reading a data image from a read-write memory that may be implemented in computing devices. This method may include accessing data within a first virtual block of the memory and scanning the memory device for a virtual boundary code. The virtual boundary code designating a boundary of second virtual block following the first virtual block. The method may also include accessing data within the second virtual block in response to recognizing the virtual boundary code. Further, the method may include reading a data image based on at least the data accessed in the first virtual block and the data accessed in the second virtual block. The method may further include accessing data in additional virtual blocks in response to virtual boundary codes being recognized therein.

Further aspects include a computing device having a processor configured with processor-executable instructions to perform various operations corresponding to the methods discussed above.

Further aspects include a computing device having various means for performing functions corresponding to the method operations discussed above.

Further aspects include a non-transitory processor-readable storage medium having stored thereon processor-executable instructions configured to cause a processor to perform various operations corresponding to the method operations discussed above.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain features of the invention.

DETAILED DESCRIPTION

Figure 1:
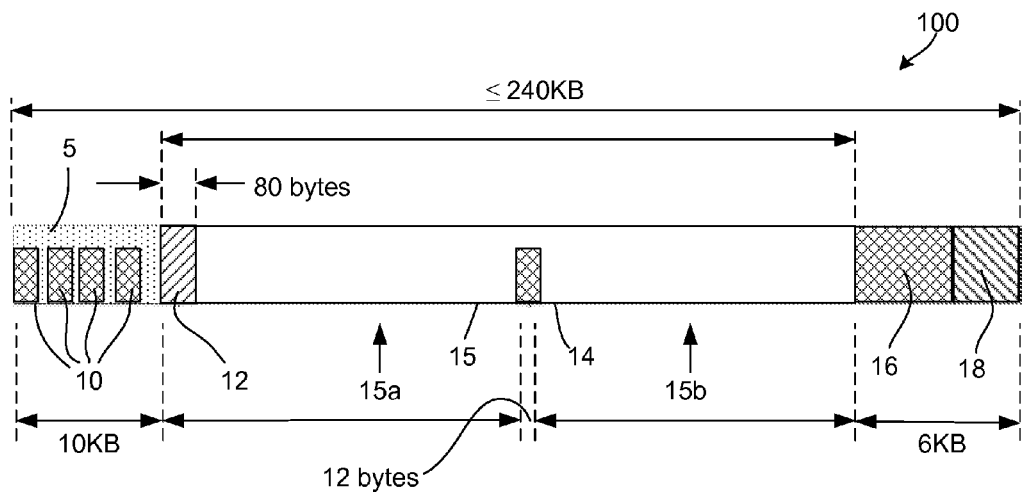
FIG. 1 is a diagram of a read-write memory device packaging in accordance with an embodiment.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. Alternate embodiments may be devised without departing from the scope of the disclosure. Additionally, well-known elements of the disclosure will not be described in detail or will be omitted so as not to obscure the relevant details of the disclosure.

The word "exemplary" is used herein to mean "serving as an example, instance, or illustration." Any implementation described herein as "exemplary" is not necessarily to be construed as preferred or advantageous over other implementations. Additionally, use of the words, "first," "second," "third," "primary," "secondary," "tertiary" or similar verbiage is intended herein for clarity purposes to distinguish various described elements and is not intended to limit the invention to a particular order or hierarchy of elements. The terms "access" or "accessing" as used herein refers to the act of interacting with an electronic storage device, or if specified a particular portion thereof, for the purpose of scanning or reading data or information thereon. Also, the terms "scan" or "scanning" as used herein mean examining, interpreting or reviewing data or information, particularly in an electronic storage device. In contrast, the terms "read" or "reading" as used herein mean obtaining, extracting, copying, or retrieving data or information, particularly in an electronic storage device.

The various aspects disclosed here provide mechanisms for storing data images to read-write memories, such as flash memory, and reading data images from such memories that obviate the need for customized and/or device-specific bad block detection/management routines. An aspect of the disclosed technologies includes a method of storing a data image to a read-write memory device, such as a flash memory device. The method includes determining a data image distribution based on a virtual block size of a series of virtual blocks designated for the read-write memory device. The virtual blocks are created in accordance with aspects herein, whereas the actual blocks are fixed parameters of the read-write memory, like flash memory. The actual block size of the read-write memory device being divisible by the virtual block size with no remainder. In this way, one or more virtual blocks will equal an actual block exactly. If the data image is larger than the virtual block size, then it is divided into portions to accommodate the block sizes of the read-write memory on which the data image will be stored. A virtual boundary code is appended to at least one of the data image portions and. The virtual boundary code may be appended to the beginning of the data image portion, marking the initial boundary of a virtual block. The data image may be part of the data and software used by a computing device in the boot process. The data image may be divided into as many portions as needed, depending upon the virtual block size and the size of the entire data image. All or part of the data image may still be stored in Block 0 of the NAND memory. The method further includes storing the data image portion in a virtual block of the series of virtual blocks. In storing data image portions, any intervening bad blocks are skipped. In this way, one or more bad blocks may be disposed between stored data image portions stored in the separate virtual blocks. A data image first and second portions may be disposed in a shared actual block of the read-write memory device. Subsequent portions of the data image may each have the virtual boundary code appended thereto. This stores the data image on the read-write memory with virtual boundary codes that a computing device can look for to locate the virtual blocks of memory to be read without having to rely upon a good/bad block list. This obviates the need for programming computing devices to accommodate various good block/bad block schemes to vary greatly. In this way, the same data image portions including those with virtual boundary codes appended thereto may be stored on additional read-write devices. Those additional read-write devices may even have different page, block and/or device-specific bad-block algorithm characteristics from one another.

Computing devices may implement an aspect method of reading a data image from a read-write memory that utilizes the data image created using the method described above. This method may be implemented in a boot loader routine that is executed for a computing device when the read-write memory is used to store the boot loader image. That boot loader image need not be the exclusive boot loader executed for the computing device. This method includes accessing data within a virtual block of the read-write memory. An actual block size of the read-write memory device being divisible by a virtual block size with no remainder, which includes a scenario where the actual block size equals the virtual block size. If the complete data image being accessed is not contained in that virtual block, then the method may scan forward in the read-write memory looking for a virtual boundary code, which designates a boundary (e.g., the beginning) of another virtual block. When the virtual boundary code is recognized, the computing device data loading routine, such as the boot loader routine, may access the data within that other virtual block. Since the memory was loaded by the method described above, the virtual boundary code indicates that the virtual block, in which the virtual boundary code was identified, is good and includes a portion of the data image that may be read. After reading in this additional block of data, if the complete data image has still not been accessed, the computing device data loading routine continues to scan the memory for further virtual boundary codes and blocks of data until the entire data image is read. The amount/size of the data image may be determined from the image header information. This process may end when the data loading routine recognizes that the entire data image has been loaded. By scanning the memory for the virtual boundary codes, bad blocks will be automatically skipped (since they will not include a virtual boundary code) and data read from only good blocks without the need for the computing device to determine in advance which blocks are bad or good. In accordance with another aspect, the method may extrapolate a size of the data image or the virtual block sizes based on information stored in the first block (e.g., in a preamble portion of the data image). The page size of the read-write memory may be inferred from the first block or preamble portion of the data image, which in-turn may be used to determine the number of pages per virtual block.

A further aspect includes a method for re-writing a flash memory with an updated or new data image, such as when the existing data image stored in the memory is updated or replaced. This method includes an initial data image in at least one initial virtual block of the read-write memory. Also, scanning forward of the at least one initial virtual block for at least one subsequent virtual block available in the read-write memory. A first portion of a new data image may be stored in the subsequent virtual block, including a virtual boundary code appended thereto. The method may further include erasing the initial data image from the at least one initial virtual block, after the entire new data image has been stored. The new data image may be re-written into that at least one initial virtual block. In fact, the re-writing of the new data and erasing of the old data may be performed as one action. However, the new data image need not be written into the very first virtual block, it can be written to one or more virtual blocks that follow. Once the entire new data image is written into that at least one initial virtual block or the one or more virtual blocks that follow the very first virtual block, the method may also include erasing the new data image from the subsequent virtual block(s) to which it was temporarily written as part of this method.

A processor of a computing device when first powered on does not generally have an operating system loaded in ROM or RAM. Thus, the processor initially executes program code stored in ROM firmware referred to as a boot loader that begins the process of booting up the system. The boot loader's job is to load other data and programs into random access memory (RAM) which are then executed by the processor. A primary boot loader is generally stored in ROM and is executed at power-up or when the device is reset. Thereafter, one or more secondary boot loaders, stored on a NAND device operatively coupled to the CPU, may allow new and/or additional application code to be loaded and executed. Traditionally multiple-stage boot loaders are used during which several programs of increasing complexity load one after the other in a process of chain loading. However, it may be advantageous to have a single variable sized boot loader in NAND flash memory that is scalable across different page and/or block sizes and bad block characteristics of the memory. Such a NAND memory boot loader may still be a secondary boot loader and/or work along with other boot loader programs.

NAND memory manufacturers and resellers do not use a uniform standard format for identifying bad blocks in their memory devices. Nonetheless, a computing device must know how to deal with bad blocks in the memory or it will otherwise not work properly or consistently. Consequently, a bad block software routine is typically included within data loader routines, including a secondary boot loader, that is configured to accommodate the bad blocks and provide methods of handling each manufacturer's/reseller's NAND memory devices that might be expected to be used with the computing device. However, NAND memory chips may be purchased from any of a number of manufacturers or resellers, and resellers may change their bad block detection information/methods. Contemporary bad block software routines deal with the variety of different bad block detection schemes by including a number of different routines into their boot loader(s) programmed into their computing devices. This is done in an attempt to deal with the varied requirements and specifications of resellers. Accommodating such variability in bad block routines can complicate the boot loader ROM firmware, and changing such routines to accommodate reseller changes is generally undesirable. Also, while a first boot loader may be designed to reside entirely within the smallest typical block 0 of the NAND memory, which is guaranteed good, this may complicate overall boot-up of the system and often duplicates drivers and boot loaders. An aspect herein cuts down on such complication and/or duplication and enables the ROM to load a boot loader that spans more than the first good block.

The disclosed embodiments include methods to limit and/or eliminate the need for the varied bad block detection schemes implemented by the NAND memory resellers for the process of loading a data image on the memory chips. By adding virtual boundary codes to enable computing devices to identify the blocks of data to be loaded without having to use resources to look up bad blocks. Implementing a universal bad block detection/handling routine for the read-write memories being processed (i.e., loaded with the data image) can be implemented as part of the machine setup.

In the various aspects, the data image to be stored on read-write memory is configured with one or more virtual boundary codes, each located at positions in the data image that correspond to virtual blocks. The virtual blocks are sized to be compatible with the block size of read-write memories that may be implemented in a computing device. The virtual block sizes may match the actual block sizes of the memories. However, to accommodate different configurations of memories (i.e., memory chips with different size actual blocks), the virtual block size may be set to a lowest common denominator size of actual blocks of all memories that might be implemented in the computing device. This enables the aspect methods to support NAND devices of different page sizes (e.g., 2K and 4K) without requiring a separate data image for each type of memory. By appending virtual boundary codes at regular positions within the virtual blocks (at least after the initial block), the same data image may be stored in the good blocks of any memory that may be implemented and any intervening bad blocks can be skipped. Such virtual boundary codes may be appended almost anywhere in the virtual block, such as the beginning.

When a data image is stored onto read-write memory, e.g., NAND memory, the reseller-specific bad block detection methods are used in order to avoid the bad blocks and only use the good blocks in a memory. However, conventional systems require routines that subsequently read that data image to also use the reseller-specific bad block detection methods. In contrast, aspects of the disclosed embodiments minimize or eliminate the need to use such reseller-specific methods when reading the data image, providing a more universal method applicable to for virtually any read-write memory device. Aspects disclosed herein store the data image in one or more virtual blocks on the read-write memory. The data image may be stored in one or more virtual blocks of the read-write memory. If more than one virtual block is needed to accommodate the entire data image, then t next available virtual block (or blocks if needed) may be used to store the remaining portions of the data image, skipping any intervening bad blocks, until the full data image is stored. The virtual blocks are defined and demarcated by virtual boundary codes appended to the portions of the data image placed in each virtual block. One embodiment places the virtual boundary code at the start of each virtual block. Also, the very first virtual block may not need a virtual boundary code, particularly since the first block on a device is generally guaranteed to be good. Also, if virtual boundary codes are placed at the start of the next and/or subsequent virtual blocks, they identify locations where portions of the data image is stored. The data image with virtual boundary codes appended thereto are stored only in good actual blocks of the memory, thus the virtual boundary codes correspond to good virtual blocks within good actual blocks of memory. As a result, a boot loader can use a single image reading process in accordance with aspects herein to recognize the virtual boundary codes and determine the blocks of memory to read, in a manner that accommodates virtually any read-write memory, regardless of manufacturer or reseller. The aspect methods can be used for booting up devices from a NAND memory, programmed as described above, such as a smartphone or other electronics with computing capabilities. Also, the aspect methods may be applied to handling fail-safe updating of the secondary boot loader.

The aspect methods may be particularly applicable to the initial boot software image that is stored in flash memory and used by a computing device, such as a smartphone or other mobile computing device, as the initial software loaded upon power up or restart. Typically such boot software is tightly controlled by the operating system, processor or device manufacturer. The company controlling the boot software typically "burns" the primary boot load image to ROM memory and the computing device then accesses read-write memory, such as NAND memory, as part of its boot routine to load the initial software image.

The aspect methods, systems and devices provide bad block handling, enabling a single secondary boot loader (referred to herein also as a boot loader and abbreviated as "BL") architecture from virtually any NAND device. In contemporary systems, the size of a secondary boot loader may be dictated by the size of internal SRAM memory. So, for example, if a SRAM size is 256 KB in a NAND device, subtracting kilobytes for the preamble generally placed in Block 0, and subtracting additional kilobytes for miscellaneous additional data, such as certificates (Certs) or padding (PAD), may leave about 240 KB in that initial actual block. That 240 KB size corresponds to the maximum size of many individual boot loaders and is greater than the minimum NAND block size of 128 KB generally implemented in read-write memories today. An aspect herein sets the virtual block size to correspond to that contemporary minimum NAND block size of 128 KB. Thus, more than one virtual block needs to be read by the primary boot loader in order to execute a 240 KB BL from that SRAM. While some contemporary FLASH memory devices have block sizes greater than the 128 KB minimum, with some having 256 KB and larger memories being developed, such larger actual blocks may include two or more virtual blocks of 128 KB. Also, aspects of the methods herein may be extended to smaller block sizes, such as 32 KB, as well.

It should be understood that the 128 KB segment size is used herein as an example for purposes of illustration only; the segments may be larger or smaller, depending on the particular NAND devices being considered. For example, if a 128 KB virtual block size is used, it may not support NAND devices with less than 64 pages per block or less than 128 KB per block. However, a smaller block size has practical limitations since the number of virtual blocks needed may increase as the virtual block size gets smaller and smaller. More virtual blocks means more scanning needed to find the valid data image, which may translate to increased boot up times.

Aspect methods divide the BL image placed on the NAND device into segments that can be placed within the 128 KB virtual block size. The 128 KB virtual block size is chosen as it corresponds to a contemporary minimum for NAND devices, but a different virtual block size may be used as desired. Virtual blocks are created by appending markers within at least a second 128 KB segment. The first 128 KB segment generally includes the BL preamble and other readable codes and thus need not include a virtual boundary code. Each segment marked by a virtual boundary code defines the virtual block and its boundaries (the two ends of a virtual block—also referred to herein as a "virtual block boundary"). The remaining portions of the BL image are divided and distributed across as many virtual blocks as are needed to accommodate the entire image. Packing data may be added to fill out an incomplete virtual block of data.

The various aspects allow developers of ROM firmware to no longer have to accommodate NAND memory reseller-defined bad block detection schemes. The various aspects do not rely upon a pre-programmed page that holds a bad/good block table. The disclosed techniques simplify the design of flash tools and build management, which previously required separate tools/builds for different NAND devices. Additionally, the disclosed device, system and methods enable fail-safe updating of the boot loader and its handling. Further, this NAND design is scalable to support different page/size NAND devices.

FIG. 1 illustrates the packaging of a NAND device 100 with a standalone boot loader 15 in accordance with various aspects. In this embodiment, a 128 KB virtual block size is used, which works for either 2 KB or 4 KB NAND devices as noted above. Thus, in order to establish a 128 KB virtual block, a virtual block boundary may be designated by a virtual boundary code 14. Such a virtual boundary code 14 is a unique and recognizable data patter that may be as little as 12 bytes of data. As an example, a virtual boundary code 14 may be the hexadecimal number: 844bdc56 73531014 d48b54c6. Although a virtual boundary code 14 that is bigger or smaller than this may be used, it need not be large since only a small amount of data is needed to demarcate a virtual block boundary. Also, consideration may be given to further portions of the SRAM reserved for the primary boot loader stack, shared areas and other data at the beginning of Block 0. Thus, the available SRAM may be smaller than the actual SRAM size.

FIG. 1 also shows a preamble 5, which includes one or more memory codes 10 that may be referred to as a preamble memory codes. Even including several preamble memory codes 10, the preamble may be assumed to not exceed 10 KB. Thus, the BL 15 may be written beginning after the first 10 KB of Block 0 of the NAND device 100. In the example illustrated in FIG. 1, the first 80 bytes of the BL 15 includes an image header 12, which designates the start of a boot loader first portion 15a and may include additional information such as the size set for the virtual blocks. Thereafter, the virtual block boundary may be marked by appending the virtual boundary code 14 at a 128 KB boundary, followed by the boot loader second portion 15b in the next 128 KB. The virtual boundary code 14 would otherwise land in the middle of a typical secondary boot loader, thus the BL 15 is divided into more than one portion 15a, 15b. By knowing the preamble size, the image header size and the size of the virtual block, a determination can be made as to the size of the first boot loader portion 15a. The remainder of the boot loader may then be included in the boot loader second portion 15b or even further portions in additional virtual blocks if necessary. Thus, some known or assumed variables may be included in the determination of how large each portion of the divided BL 15 can be. For example, consider the following parameters:

SRAM size=256 KB
SRAM reserved/used=~16 KB
Virtual block size=128 KB
Preamble (5) size (including preamble memory codes 10)=10 KB
Boot loader Image header (12) size=80 B
Signature and Certificates (16) plus padding (18)=6 KB
Virtual Boundary Code (VBC) size=12 B.

Subtracting the total of the above bytes used from the SRAM size leaves approximately 223 KB remaining for the boot loader in the NAND memory which can be stored in two 128 KB virtual blocks.

Figure 2:
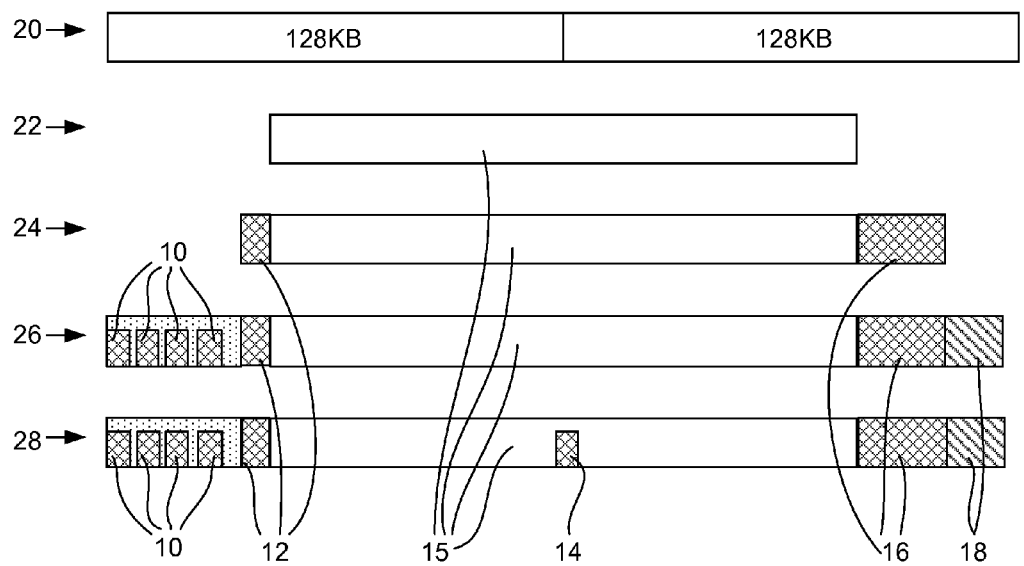
FIG. 2 illustrates process steps for configuring the read-write memory device of FIG. 1.

FIG. 2 shows another way to consider the spacing and distribution of the boot loader 15. Initially at 20 the virtual block size may be established at 128 KB, thus two such virtual blocks would be included in a 256 KB SRAM. At 22 the size of the BL 15 may be considered, which may span at least two of the virtual blocks. Then at 24 the image header 12 and certificates 16 are added to the total length of the BL 15 image. Also, at 26 the preamble 5, including preamble memory codes 10, and padding 18 are added to the total length of the image. Further, at 28 the virtual boundary code is appended between the two portions 15a, 15b of the BL 15, which corresponds in this embodiment to the first 128 KB virtual boundary. Taking these parameters into account, the page sizes of the actual device will determine how many actual blocks will be used, as well as how many virtual blocks will be used. For example, consider a NAND device with pages that are 4K in size. Such a device would have actual blocks of 256 KB, leaving roughly 223 KB for the boot loader in Block 0. Thus, a 4K NAND device would only need one good block to hold this BL. If a virtual block size of 128 KB is used, then that one good actual block would include two virtual blocks. Now consider a NAND device with pages that are only 2k in size. This device would require two good actual blocks. The size of these actual blocks coincides with the virtual block size of 128 KB. Thus, Block 0 of the 2K NAND only leaves approximately 118 KB of space for the first BL portion 15a (128 KB less 10 KB preamble 5, less 80 B image header 12). The remaining second BL portion 15b may then be placed in the next good block designated by the virtual boundary code 14.

Figure 3:
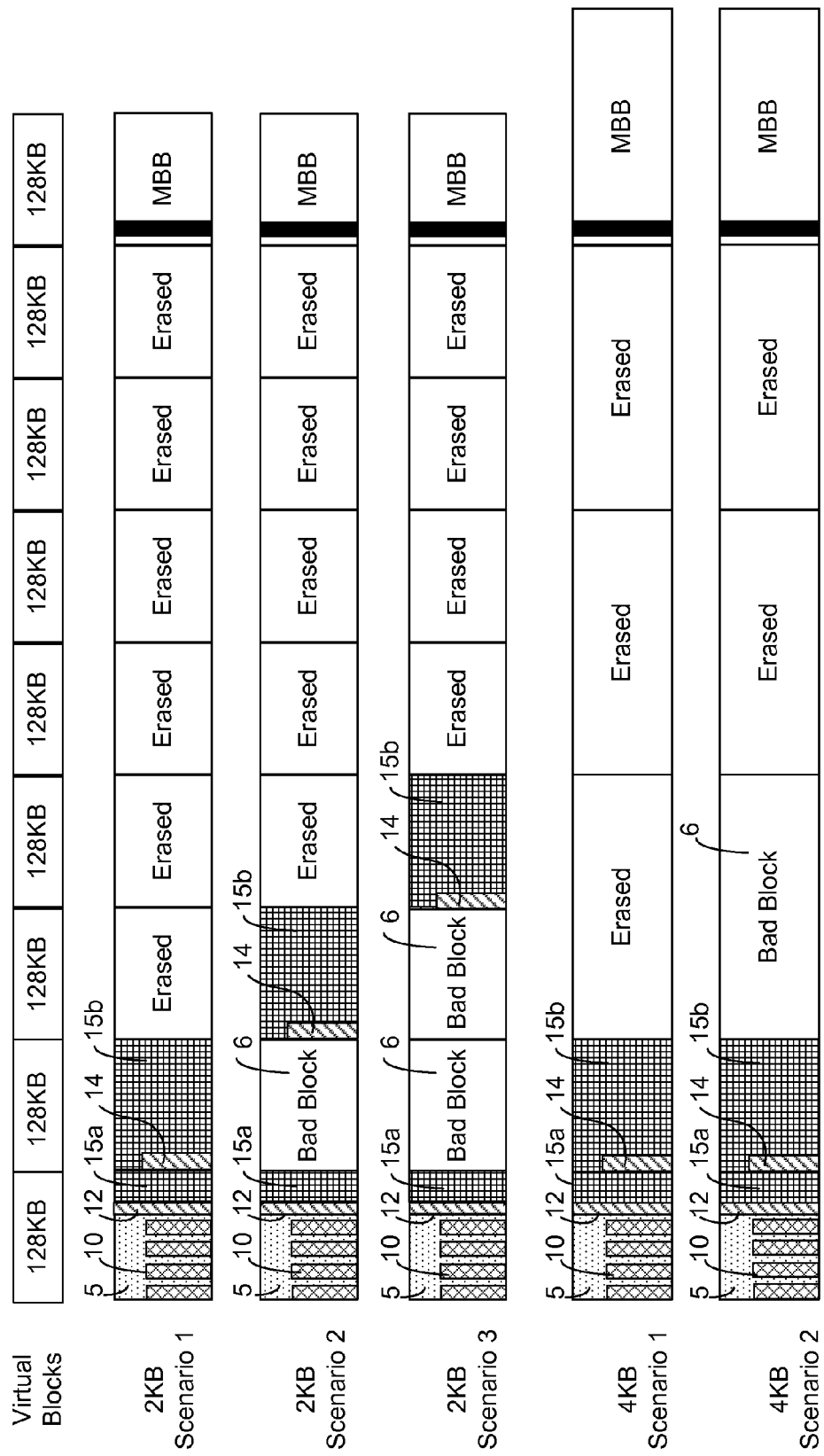
FIG. 3 illustrates five read-write memory device packaging scenarios, in accordance with an embodiment.

FIG. 3 shows how the example boot loader distribution may play-out in various scenarios. The five scenarios depicted all use a 128 KB virtual block size (shown as a series of virtual blocks above the five scenarios. Three of the scenarios consider a 2 KB NAND device and the other two scenarios considering a 4 KB NAND device. In the 2 KB scenarios, the virtual block size coincides with the actual block size of 128 KB. In the 4 KB Scenarios, the virtual blocks are half the size of the actual blocks.

In the 2 KB Scenario 1, the division and distribution of the boot loader is straight forward, with the virtual boundary code 14 placed at the beginning of Block 1, which coincides with the first virtual block boundary marked on the device. It should be noted that the virtual blocks coincide with the actual blocks in the 2 KB scenarios. As with the coding of the NAND memory described above, the Block 0 also includes a preamble 5, with preamble memory codes 10, a boot loader image header 12 and a first boot loader portion 15a. The second boot loader portion 15b follows the virtual boundary code 14, which is appended thereto and marks the beginning of the virtual block in this embodiment. This 2 KB scenario 1 applies to a NAND device in which Block 1 is good, so the first and second virtual blocks are consecutive good blocks. However, manufacturers only generally guarantee Block 0 to be good, thus consider the second and third scenarios for the 2K NAND device. In 2 KB Scenario 2, Block 1 is bad but Block 2 is good. Thus, since Block 1 is bad, the virtual boundary code 14 may not be written into that block. Rather, the next good block, namely Block 2, is where the virtual boundary code 14 is then written, along with the second boot loader portion 15b. The 2 KB Scenario 3 has two initial bad blocks (Block 1 and Block 2) following Block 0. Thus, in this case the virtual boundary code 14 is written at the boundary after the last of those two bad blocks, which is the beginning of the next good block (Block 3). Similarly in that scenario the remainder of the BL (the BL second portion 15b) is written into Block 3.

In the 4 KB Scenarios, it virtually doesn't matter whether Block 1 is good or bad since the boot loader may generally be accommodated entirely within Block 0, which is large enough to include two virtual blocks. Thus, the 4 KB Scenario 1 shows a situation where Block 1 is good, but is not needed because the BL first portion 15a and BL second portion 15b can both be written entirely into Block 0. Also, the 4 KB Scenario 2 illustrates how both portions of the BL 15a, 15b can still be entirely written into its Block 0, making it irrelevant that Block 1 in that scenario is bad.

Figure 4:
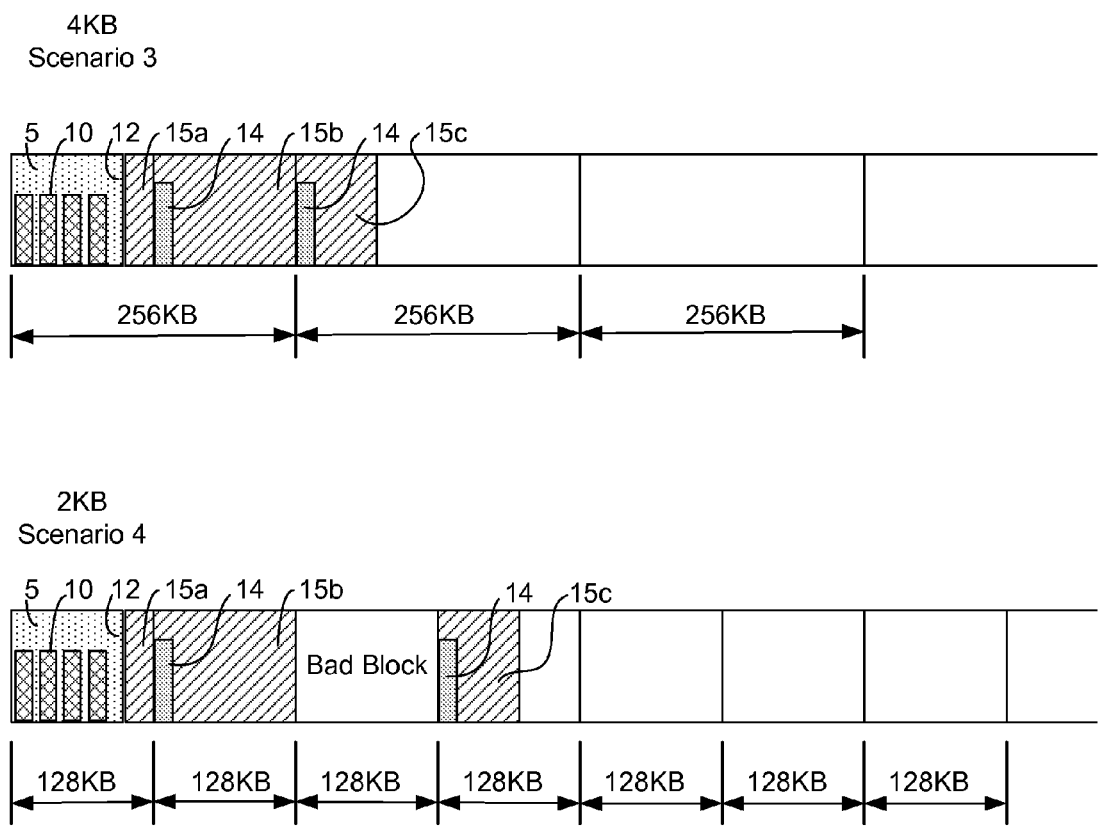
FIG. 4 illustrates two additional read-write memory device packaging scenarios, in accordance with an embodiment.

FIG. 4 shows two more scenarios of boot loader distributions. The first scenario in FIG. 4 is a 4 KB scenario 3, which includes a larger BL that needs to be split up into three portions 15a, 15b, 15c. As the second actual block, Block 1, is good, the data image is spread across consecutive virtual/ actual blocks. However, had Block 1 been bad, the second virtual boundary code 14 and the BL third portion 15c could have been stored in Block 2. The second scenario in FIG. 4 is a 2 KB scenario 4. Once again the larger BL is used that needs to be split up into three portions 15a, 15b, 15c, but here the third block, Block 2, is bad. Thus, the fourth block, Block 3, is used to store the second virtual boundary code 14 and the BL third portion 15c.

Figure 5:
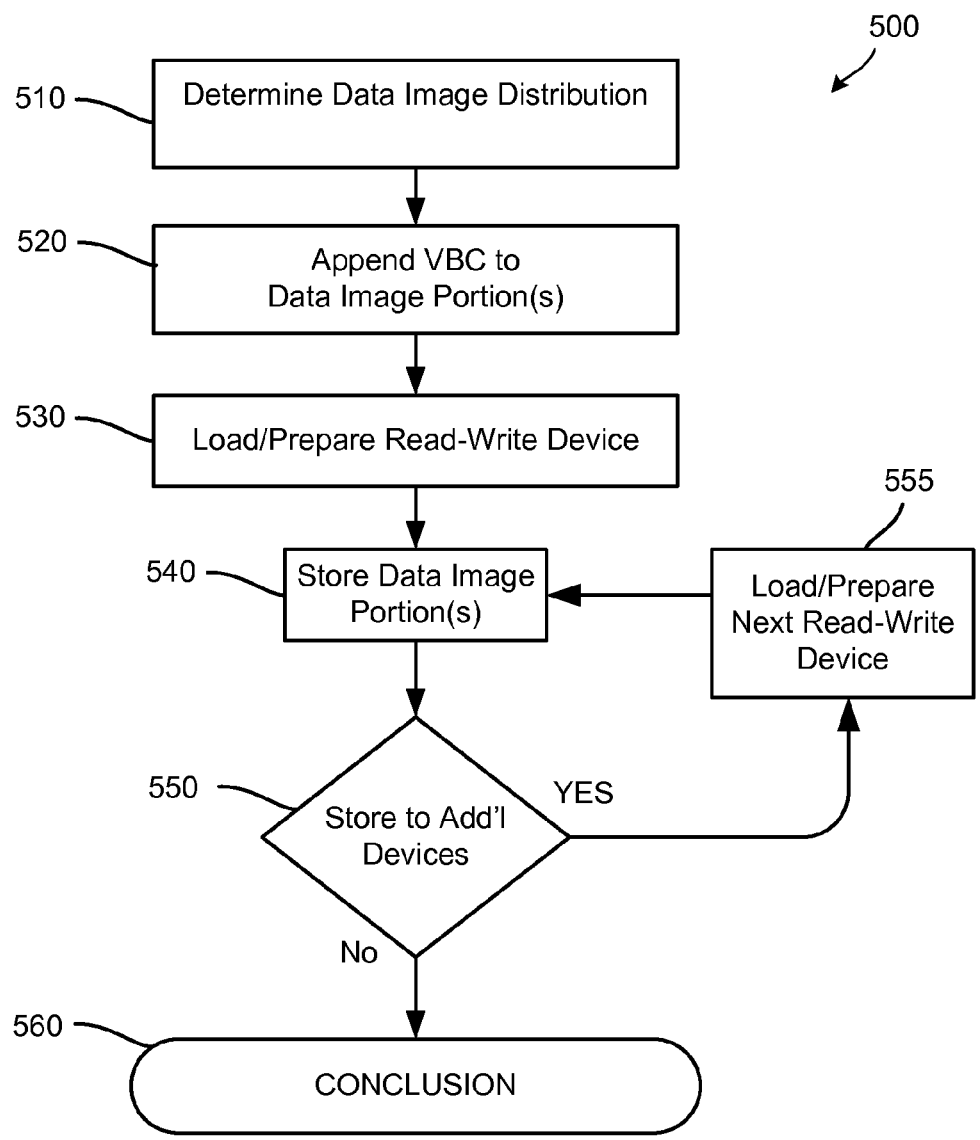
FIG. 5 is a process flow diagram illustrating an aspect method of storing a data image on a read-write memory.

FIG. 5 shows an aspect method 500 of storing a data image on a read-write memory device. The data image may be a boot loader in accordance with aspects herein. In block 510 a data image distribution is determined for packaging the data image based on a virtual block size of a series of virtual blocks designated for the read-write memory device. As part of this determination, the data image may need to be divided into at least a data image first portion and a data image second portion, if the entire data image is too large for a single virtual block. In block 520 a virtual boundary code is appended to at least one of the data image first portion and the data image second portion. In this embodiment, the virtual boundary code is appended to the beginning of the data image second portion. In block 530 a read-write device, such as a NAND device, is loaded and prepared for data storage thereon. In block 540 the data image first portion is stored in a first virtual block of a series of virtual blocks. In block 540, a virtual boundary code (VBC) is stored, marking the next virtual block (and thus designates the second of a series of virtual blocks), which will naturally coincide with a good actual block. In storing the VBC and designating a virtual block, any intervening bad blocks between the first virtual block and the second virtual block are skipped over within the read-write memory. The programming tools used to physically write the data image may perform reseller specific checks for factory marked bad blocks and skip the bad blocks as necessary. The object of the programming tools may be to store and/or incorporate the VBCs within the data image. Thus, the programming tools need not recognize or even deal with VBCs, since VBCs are made a part of the data image to create patterns that can be read independent of reseller bad block management schemes. Such programming tools may have a NAND driver as well, but unlike the NAND driver in the ROM, the programming tools NAND driver need not be restricted in size or complexity. This allows the programming tools to fix bugs following revisions or updates to a product, and even handle new NAND reseller-specific bad block checking schemes. In this way, functionality may be added, removed, changed or enhanced in such programming tools, as compared to the NAND driver in the ROM. In block 540 the second (next) portion of the data image may also be stored in the same virtual block as the VBC, which is the second virtual block of the series of virtual blocks. A determination may be made regarding whether the complete data image has been stored. If not the method may continue to store another VBC at the next available virtual block and again stores the next portion of the data image. This will proceed until all portions of the data image are stored. Once a complete data image (e.g., the boot loader image) has been stored, a determination may be made in determination block 550 regarding whether there are additional devices in which the data image is to be stored. If there are additional devices intended to receive the data image (i.e., determination block 550="YES") in block 555 the next read-write device, such as another NAND device, may be loaded and prepared for data storage thereon and the process may return to block 540. Otherwise, if there are no additional devices for storing the data image (i.e., determination block 550="No") the process reaches its conclusion in block 560. The process 500 can thus be repeated in series or in parallel with additional read-write devices.

Positioning the VBC at the beginning of the virtual block aids in immediately detecting good blocks and may optimize a boot-loading process. A single pass reading of a virtual block may detect the VBC and at the same time read the boot loader data image contained in that block. Alternatively, the virtual boundary codes need not be placed at the beginning of the virtual blocks. For example, a VBC may be placed at the end of each virtual block (including Block 0) or in virtually any position desired. Positioning information regarding the one or more VBC's may be included in the image header discussed above.

Figure 6:
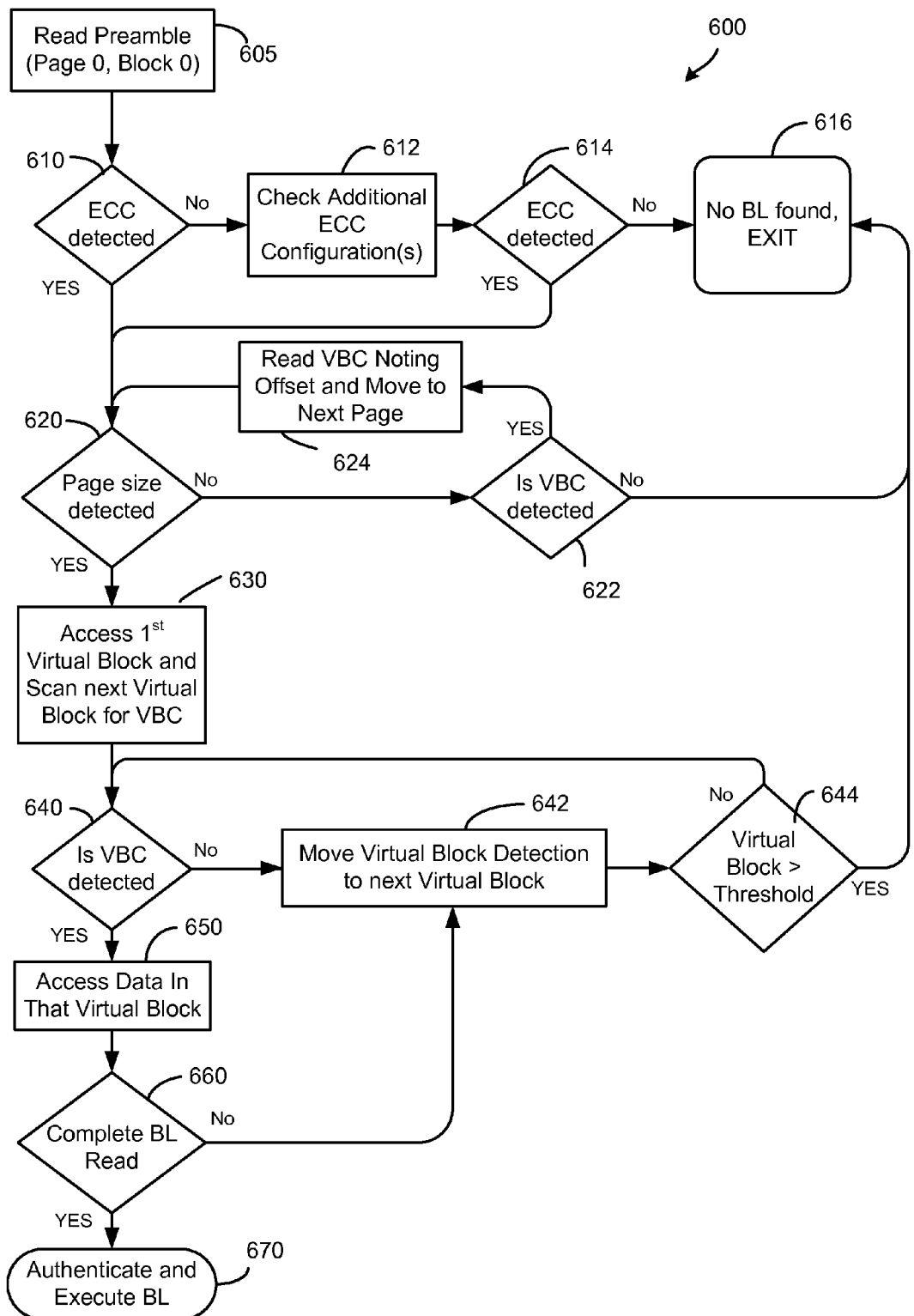
FIG. 6 is a process flow diagram of an aspect method of reading and executing a boot loader from a read-write memory device.

Once the NAND device has one or more virtual boundary codes written thereto, a primary boot loader can parse the device to find those virtual boundary codes and read, authenticate and run the complete secondary boot loader using the virtual boundary markers like guideposts. FIG. 6 shows an aspect method of reading a data image from a read-write device.

FIG. 6 illustrates an aspect method 600 of reading a data image from a read-write memory. For example, a NAND parser in a primary boot loader may implement method 600 to read, load and authenticate a secondary boot loader. In block 605 the read-write device is read, starting with the preamble in Block 0, which also coincides with page 0 of the device. The preamble may contain device width and page size information that may be used by a data loading routine. In block 610 error correction coding (ECC) detection may be performed, since ECC is preferably enabled for the current method. This operation may default to 4 bit BCH error correction coding or other coding. If reading of the programmed page is unsuccessful such that ECC is not detected, then in block 612 additional ECC configurations can be checked. For example, an 8 bit BCH ECC may be used or a 4 bit BCH ECC if it was not the default. Thus, one or more additional ECC configurations can be checked, so that if no ECC is ever detected in block 614 then a conclusion is reached in block 616 meaning no boot loader (BL) can be found and the process exits. Alternatively, the method may check for a valid preamble using an AUTO_DETECT routine and a weighted algorithm check. Otherwise, if ECC is detected in either block 610 or block 614, the method proceeds to block 620 where page size detection is performed. In block 620 consecutive pages may be read to verify virtual boundary code size and/or position in order to calculate an actual NAND page size. If no page size is detected at decision block 620, a check as to whether any virtual boundary code (VBC) is detected is made at further decision block 622. If the VBC is detected at 622, the VBC is read at 624 noting its offset (position and size) and moving to the next page, returning to the page size detection decision block 620. If VBC was not detected in 622, a conclusion may be reached in block 616, meaning no boot loader (BL) can be found and the process exits. If a page size is detected in decision block 620, a determination may be made as to the number of pages per virtual block by dividing the virtual block size by the page size. ROM may use this determination to know how many fixed pages need to be read before proceeding to the next virtual block. Once the page size is detected, the data image in the first virtual block may be accessed in block 630 and even copied. Thus, the remaining pages may be read out of that first virtual block, resulting in all the data within the first virtual block of the data image being accessed. The process may then proceed to scan the next virtual block for a VBC. If no VBC is detected at 640, the next virtual block may be bad and/or corrupted. Thus, in block 642 the process scans the next virtual block for a virtual boundary code. A threshold (also referred to as a time-out function) may be used for how many virtual blocks may be checked, in order to ensure the process does not continue in an endless loop. Thus a threshold, such as 15 virtual blocks, may be used and if that threshold is reached at 644, this may mean no BL can be found and the process exits at 616. If the virtual block threshold is not reached, the cycle continues/returns to block 640 until a virtual boundary code is detected in block 640. Once a VBC is detected at 640, all data within the next virtual block may be accessed in 650. That next virtual block corresponds to the virtual block where the VBC was found and may be accessed. At 660 a determination may be made as to whether the complete data image (e.g., the complete BL) has been read. If the complete BL has not been read at 660, in block 642 the process scans the next virtual block for a virtual boundary code as proceeds further from there as described above. If the complete BL has been read at 660, at 670 the BL may be authenticated and executed, thus loading the BL from the data represented by the data image in the first and second virtual blocks. The BL loaded may skip (need not include) the virtual boundary code bytes, which are only meant as a marker and need not be loaded.

The aspect method shown in FIG. 6 illustrates how bad blocks are skipped so that when a bad block is disposed between the first and second virtual blocks, or subsequent virtual blocks, the data loading routine (e.g., a primary boot loader) is able to read the entire data image (e.g., a secondary boot loader) without first identifying the good or bad blocks in the memory. Thus, a data loading routine will skip over a bad block following the first virtual block because no virtual boundary code will be detected in the bad virtual block. Also, the first virtual boundary code may be left out of the execution of the secondary boot loader, since those bytes may be needed as markers only.

An additional aspect includes failsafe update provisioning, such as through over the air (OTA) downloads for wireless devices. In this regard, many devices that include read-write memory, such as smart phones that include flash memory, often require upgrades or updates to firmware. The disclosed bad block management design enables such upgrades in a reliable/failsafe manner using an extension of the above-described techniques. Initially, the system detects the blocks in which the current boot loader is present. Then it advances forward to one or more additional good block available for a newer/replacement boot loader to be written. Thereafter, the new boot loader can be programmed using the new good block location as a back-up in case something interrupts the upgrade/update process. Then the old boot loader may be erased at the initial location, such as starting at Block 0, and the new secondary boot loader reprogrammed at Block 0 and subsequent good blocks if necessary.

Figure 7:
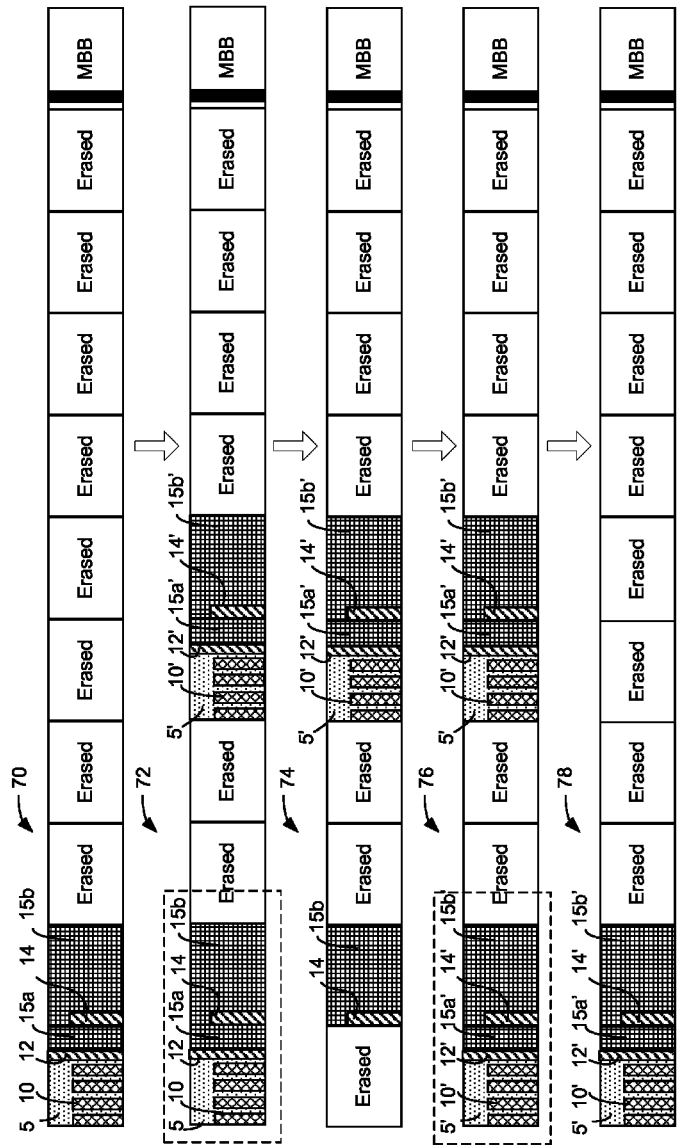
FIG. 7 illustrates process steps for re-writing an image on a read-write memory device.

FIG. 7 shows an example of a method of revising an image on a NAND device in accordance with the various aspects. This upgrade method is fully compatible with the virtual block designations, using the virtual boundary code described above. In initial state 70 the system accesses the data within the first blocks in which the current boot loader is present. Those blocks may include a preamble 5, with preamble memory codes 10, and image header 12. In the example shown, the boot loader is divided into two portions 15a, 15b disposed in two initial blocks, which may correspond to virtual blocks or actual blocks, depending on the NAND device, and may include a virtual boundary code 14 in accordance with aspects herein. Alternatively, the original boot loader may be a single continuous boot loader in accordance with the prior art, which may be replaced in accordance with the methods herein. At this stage the system may determine the size of the actual blocks (or virtual blocks if present) in order to further determine how many blocks are needed for the new data image, including any boot loader portions 15a', 15b', a new preamble 5' with new preamble memory codes 10', new image header 12' and any necessary new VBCs 14'. The system may scan forward on the flash memory device in order to find the next available good block(s). If more than one good block is needed for the new boot loader, then the system may continue to scan forward on the flash memory device until sufficient available good blocks are found to accommodate the new data image. In the state illustrated at 72 the system then stores the new data image, including the boot loader portions 15a', 15b', a new preamble 5' with new preamble memory codes 10', new image header 12' and a new VBCs 14' in the available good blocks identified. In accordance with an aspect of the invention, the available good blocks need not be the very next sequentially available good blocks. In the example shown, at least two blocks are skipped, in order to provide a buffer between the old and new blocks being changed as part of this method. Leaving at least a couple of blocks also allows the method to account for future growth in the size of the initial boot loader, which may take-up more than the one or two initial blocks needed for contemporary systems. Also, leave some space can also avoid bad blocks in those initial blocks of the device. Before erasing the older boot loader, a verification check may be performed on the new data image. At the stage shown at 72, the system would still boot off the older boot loader portions 15a, 15b, as a failsafe in case the new data image did not load correctly, is corrupted or otherwise unusable. Once, the new data image is loaded (and optionally authenticated), in the state illustrated at 74 the old boot loader, or at least an initial portion thereof, may be erased. In particular, if at least one of the old preamble 5, old image header 12 or initial portion of the boot loader 15a is erased, then the old boot loader will get skipped by a primary boot loader looking for those elements. While the second block illustrated at 74 is not shown as being erased, that block may be erased before proceeding to the next step. Thereafter, in the state illustrated at 76 the system then stores the first blocks with the new data image, virtually identical to the new data image previously stored at stage 72. Thus at stage 76, the new data image may be found in two places on the NAND device, which serves as a back-up in case there was an error in marking the first blocks. Once the data image in the initial blocks is authenticated, the method of revising may conclude. The second copy of the newer data image may be left on the NAND device as a backup. Alternatively, the method may then further in the state illustrated at 78 erase the second copy of the new data image from the good blocks in which it was marked in the state illustrated at 72.

In FIG. 7, the various blocks not pertaining to the subject data image are indicated as "Erased." However, those blocks need not be blank or ever have been erased. In accordance with aspects herein, the methods may determine the size and location of the boot loader, using the preamble and virtual boundary codes, thus those blocks noted as "erased" are intended to indicate blocks of data not pertinent to the boot loader image.

Figure 8:
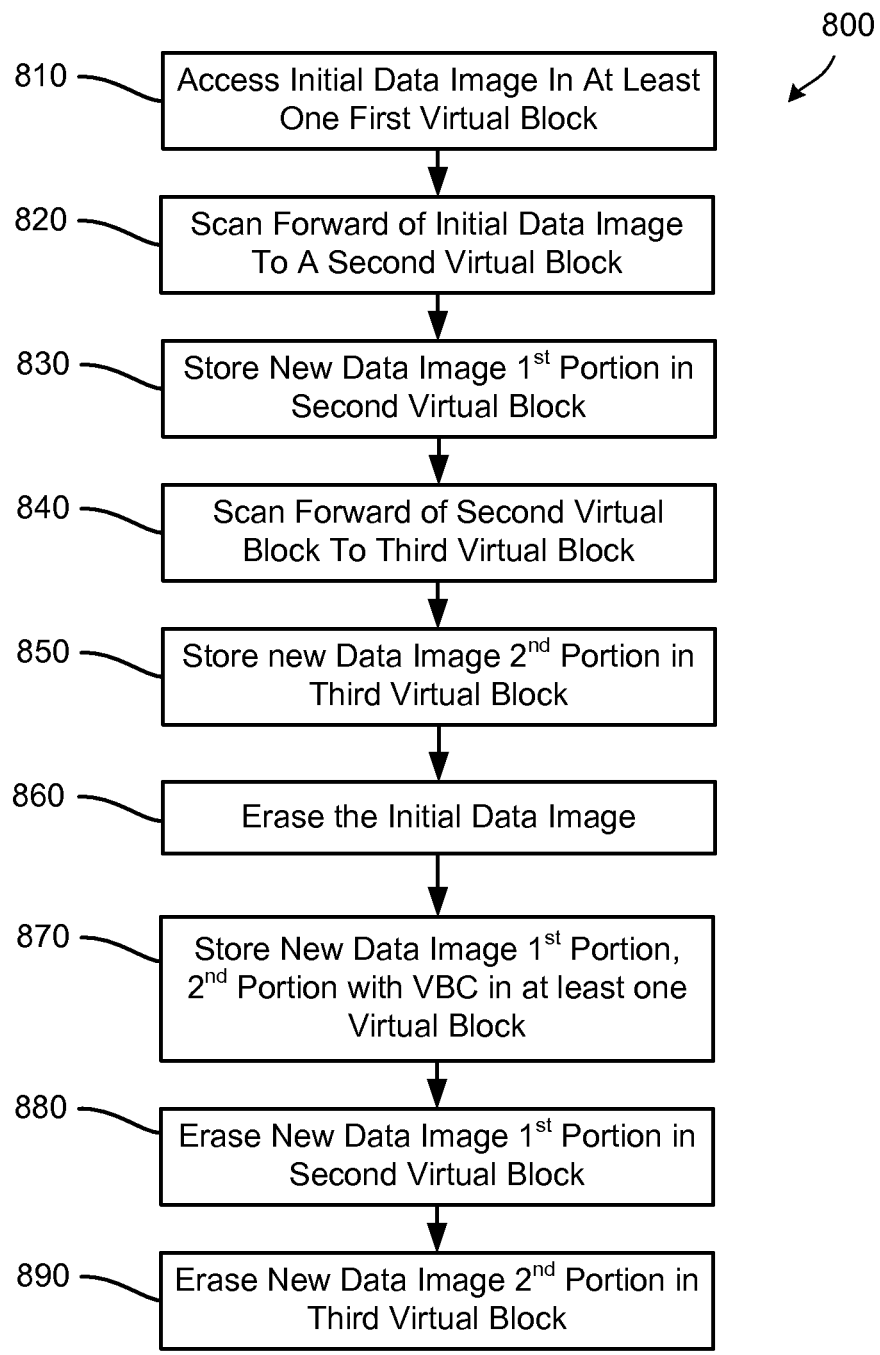
FIG. 8 is a process flow diagram of an aspect method of re-writing an image on a read-write memory device.

In FIG. 8, illustrates an aspect method 800 of re-writing a data image on a read-write memory. In block 810 an initial data image is accessed in at least one first virtual block of the read-write memory. The at least one first virtual block may include more than one first virtual block. In block 820 the method scans forward of the at least one first virtual block for at least one second virtual block available in the read-write memory. Thus, if the at least one first virtual block included more than one virtual block, then the "second virtual block" as defined in method 800 would follow those preceding first virtual blocks. In block 830 a first portion of a new data image is stored in the second virtual block. In block 840 the method scans forward of the second virtual block to a third virtual block. Once a third virtual block is located, at 850 a second portion of the new data image is stored in the third virtual block. Block 860 includes erasing the initial data image within at least a portion of the at least one first virtual block. Either the entire initial data image or just a portion thereof may be erased in block 860. For example, in block 860 the initial data image may be erased from more than one first virtual block. At 870 the new data image first portion and second portion including a VBC are stored in the at least one first virtual block. In block 880, the new data image first portion is erased from the second virtual block. In block 890, the new data image second portion is erased from the third virtual block.

A preamble block may be used for deriving various device characteristics. If a valid preamble block is not initially found, the process may continue traversing the blocks to attempt to find one. A preamble block may be detected by checking for a particular code, such as a virtual boundary code, in the initial bytes of a block (e.g., the first 12 bytes) read as part of a flash read command. In accordance with a disclosed aspect, a generic NAND device width handling technique may be desirable. An algorithm may be used to count detected virtual blocks that have been designated as such. If a virtual block count is not obtained using this technique, the process may exit concluding no secondary boot loader has been found. Otherwise, in this way the virtual boundary codes may be used to determine the size of the virtual blocks and NAND device itself. Also, ECC detection and page size detection may be implemented as part of the methods disclosed herein. For example, an auto-page size detection algorithm may read the number of pages marked with a specific virtual boundary code in order to determine how many pages are on the device and thus its page size.

Figure 9:
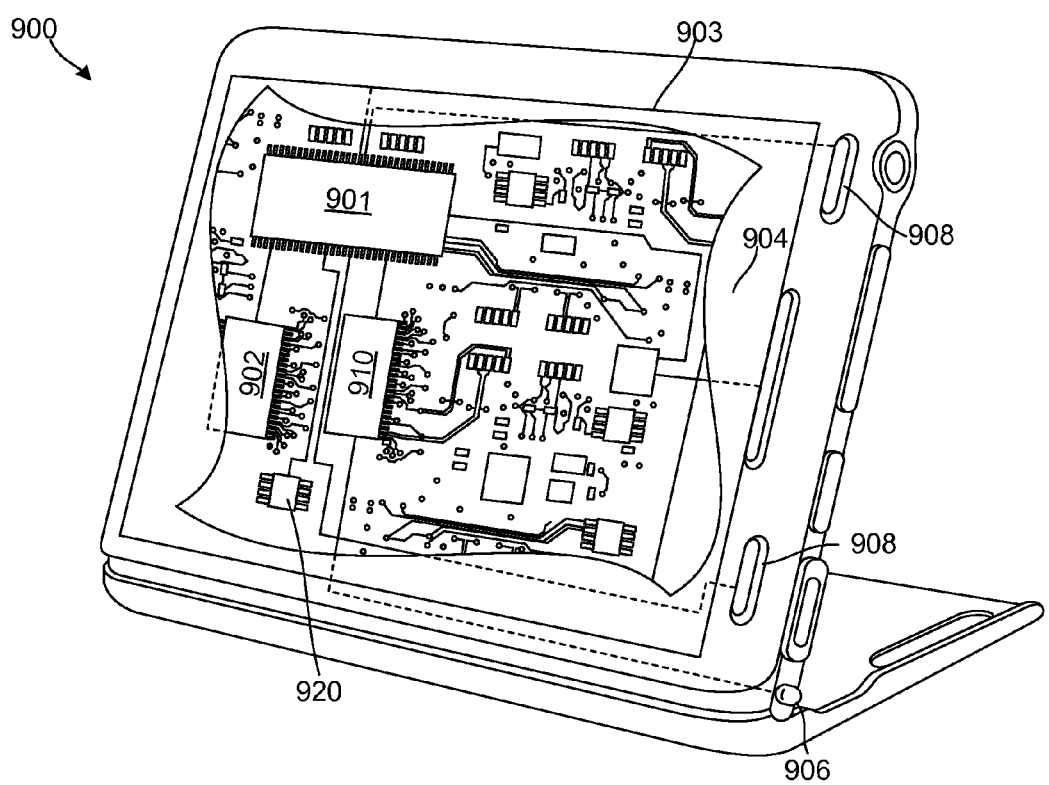
FIG. 9 is a component diagram of a computing device suitable for use with the various embodiments.

Additionally, the various embodiments may be implemented in and/or with any of a variety of mobile computing devices, an example of which is illustrated in FIG. 9 in the form of a cellular telephone. Typical mobile computing devices 900 will have in common the components illustrated in FIG. 9. For example, mobile computing devices 900 may include a processor 901 coupled to an internal memory 902 and a touch surface input device/display 903, such as a resistive sensing touchscreen 904, capacitive sensing touchscreen, infrared sensing touchscreen, acoustic/piezoelectric sensing touchscreen, or the like. The mobile computing device 900 may have a radio/antenna 906 for sending and receiving electromagnetic radiation that is connected to a wireless data link and/or cellular telephone transceiver 920 coupled to the processor 901. Mobile computing devices 900 may also include a GPS receiver coupled to the processor 901 for determining locations of the device. Mobile computing devices 900 may also include physical buttons 908 for receiving user inputs.

Figure 10:
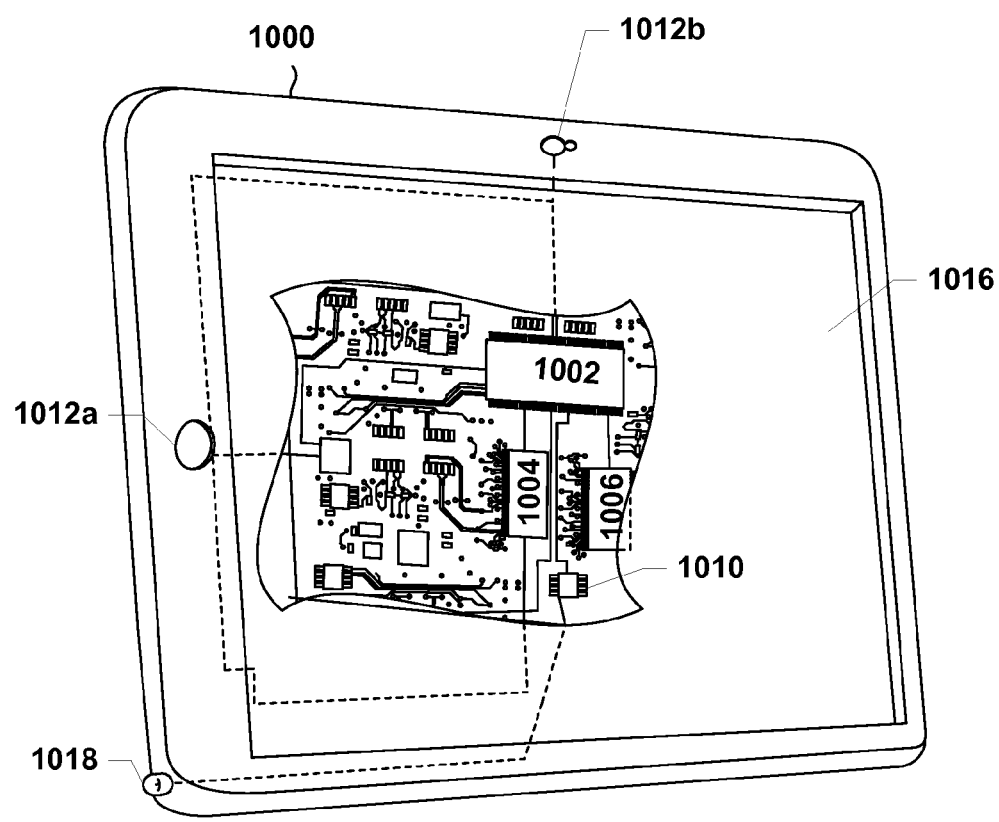
FIG. 10 is a component diagram of another computing device suitable for use with the various embodiments.

The various embodiments may be implemented in and/or with any of a variety of computing devices, such as a tablet computer, an example of which is illustrated in FIG. 10. For example, the wireless device 1000 may include a processor 1002 coupled to internal memories 1004 and 1006. Internal memories 1004 and 1006 may be volatile or non-volatile memories, and may also be secure and/or encrypted memories, or unsecure and/or unencrypted memories, or any combination thereof. The processor 1002 may also be coupled to a user interface, such as a touch screen display 1016 (e.g., a resistive-sensing touch screen, capacitive-sensing touch screen infrared sensing touch screen, or the like), or conventional buttons (e.g., 1012*a* and 1012*b*) and a non-touch screen display. Additionally, the wireless device 1000 may include one or more network transceivers configured to enable the processor 1002 to communicate with other computing devices over one or more wired or wireless networks. As a particular example, the network transceivers of a wireless device 1000 may include one or more antenna 1018 for sending and receiving electromagnetic radiation that may be connected to one or more wireless data link transceiver and/or cellular telephone transceiver 1010 coupled to the processor 1002. The wireless device 1000 may also include physical buttons 1012*a* and 1012*b* for receiving user inputs.

Figure 11:
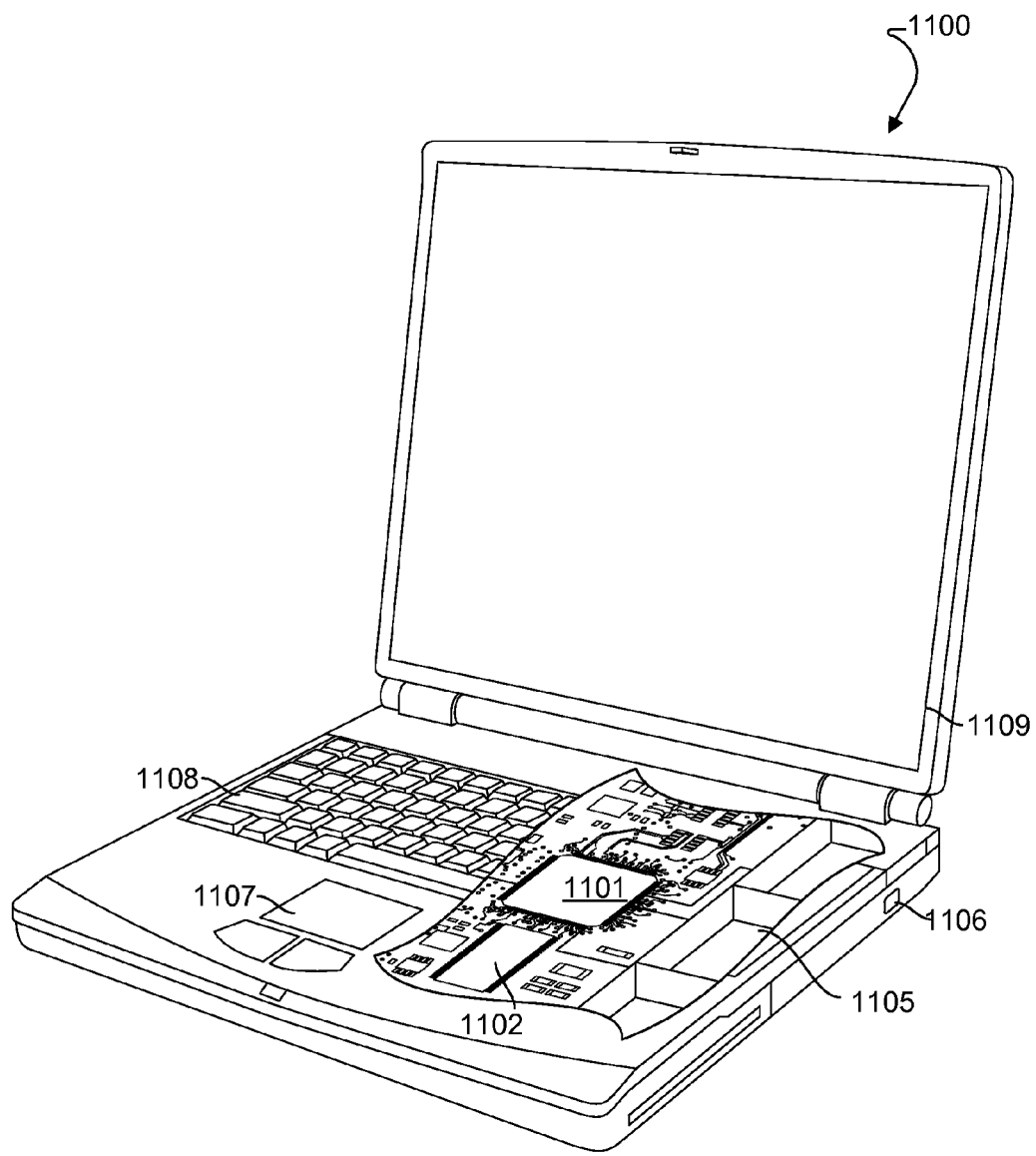
FIG. 11 is a component diagram of another computing device suitable for use with the various embodiments.

The various embodiments described above may also be implemented within and/or with a variety of personal computing devices, such as a laptop computer 1100 as illustrated in FIG. 11. Many laptop computers include a touch pad touch surface 1107 that serves as the computer's pointing device, and thus may receive drag, scroll, and flick gestures similar to those implemented on mobile computing devices equipped with a touch screen display and described above. A laptop computer 1100 will typically include a processor 1101 coupled to volatile memory and a large capacity nonvolatile memory, such as a flash memory device 1102. The laptop computer 1100 may also include a floppy disc drive and a compact disc (CD) drive coupled to the processor 1101. The laptop computer 1100 may also include a number of network transceivers or network connector ports coupled to the processor 1101 configured to enable the processor 1101 to communicate with other computing devices one or more wired or wireless networks. As a particular example, the network transceivers of a laptop computer 1100 may include Ethernet, USB or FireWire® connector sockets/transceivers, one or more wireless modem transceivers, such as Wi-Fi and/or cellular data network transceivers, coupled to one or more antenna for sending and receiving electromagnetic radiation. The laptop computer 1100 may also include other types of network connection circuits for coupling the processor 1101 to a network that may be developed in the future. In a notebook configuration, the computer housing includes the touch pad touch surface 1107, the keyboard 1108, and the display 1109 all coupled to the processor 1101. Other configurations of the computing device may include a computer mouse or trackball coupled to the processor (e.g., via a USB input) as are well known, which may also be used in conjunction with the various embodiments.

The processors in the various embodiments described herein may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wireless communication functions and one processor dedicated to running other applications. Typically, software applications may be stored in the internal memory before they are accessed and loaded into the processors. The processors may include internal memory sufficient to store the application software instructions. In many devices the internal memory may be a volatile or nonvolatile memory, such as flash memory, or a mixture of both. For the purposes of this description, a general reference to memory refers to memory accessible by the processors including internal memory or removable memory plugged into the device and memory within the processor themselves.

The foregoing method descriptions and the process flow diagrams are provided merely as illustrative examples and are not intended to require or imply that the blocks of the various embodiments must be performed in the order presented. As will be appreciated by one of skill in the art the order of blocks in the foregoing embodiments may be performed in any order.

Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks and process flow diagram blocks described in connection with the embodiments disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

One skilled in the relevant art will recognize that many possible modifications and combinations of the aspects of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations are possible in view of the above teachings. The embodiments were chosen and described to explain the principles of the disclosure and their practical applications, and to enable others skilled in the art to best utilize the disclosure and various embodiments with various modifications as suited to the particular use contemplated. Thus, the present disclosure is not intended to be limited to the embodiments and individual aspects of the disclosed technologies shown and described herein, but is to be accorded the widest scope consistent with the following claims and the principles and novel features disclosed herein.

What is claimed is:

1. A method of storing a data image on a read-write memory device, the method comprising:
   setting a virtual block size that is common for a series of virtual blocks designated for both a first read-write memory device and a second read-write memory device, wherein the virtual block size is based on a first size of each of a series of actual blocks of the first read-write memory device and a second size of each of a series of actual blocks of the second read-write memory device, wherein the first size and the second size are different, wherein each of the actual blocks of the first read-write memory device and each of the actual blocks of the second read-write memory device comprises a plurality of pages, and wherein each virtual block comprises a plurality of pages of the plurality of pages of the actual blocks of the first read-write memory device or the plurality of pages of the actual blocks of the second read-write memory device;
   dividing a boot loader into a first boot loader portion and a second boot loader portion based on the virtual block size, wherein the first boot loader portion and the second boot loader portion are different, wherein a size of the boot loader is greater than the virtual block size, and wherein the size of the boot loader is greater than one or both of the first size or the second size;
   appending a virtual boundary code to the first boot loader portion, the virtual boundary code representing a marker for locating the first boot loader portion; and
   storing the first boot loader portion with the virtual boundary code appended thereto in a virtual block of the series of virtual blocks on the first read-write memory device.

2. The method of claim 1, wherein the virtual boundary code is appended at the beginning of the first boot loader portion.

3. The method of claim 1, wherein both the first size and the second size are divisible by the virtual block size with no remainder.

4. The method of claim 1, further comprising:
storing the second boot loader portion in another virtual block of the series of virtual blocks on the first read-write memory device.

5. The method of claim 4, wherein a bad block within the first read-write memory device is located between the first boot loader portion and the second boot loader portion.

6. The method of claim 4, wherein the first boot loader portion and the second boot loader portion are stored in a shared actual block of the series of actual blocks on the first read-write memory device.

7. The method of claim 1, wherein each virtual block includes the same virtual boundary code.

8. The method of claim 4, wherein the second boot loader portion includes an image header containing information regarding at least one of a position of the virtual boundary code on the first read-write memory device and the size of the boot loader.

9. The method of claim 4, further comprising:
appending the virtual boundary code to a third boot loader portion; and
storing the third boot loader portion with the virtual boundary code appended thereto in a third virtual block of the series of virtual blocks.

10. The method of claim 1, further comprising:
storing the first boot loader portion with the virtual boundary code appended thereto in a virtual block on the second read-write memory device, wherein at least one of a page size and a device-specific bad-block algorithm characteristic are different between the first read-write memory device and the second read-write memory device.

11. A computing device for storing a data image on a read-write memory device, the computing device comprising:
a memory; and
a processor coupled to the memory and configured with processor-executable instructions to perform operations comprising:
setting a virtual block size that is common for a series of virtual blocks designated for both a first read-write memory device and a second read-write memory device, wherein the virtual block size is based on a first size of each of a series of actual blocks of the first read-write memory device and a second size of each of a series of actual blocks of the second read-write memory device, wherein the first size and the second size are different, wherein each of the actual blocks of the first read-write memory device and each of the actual blocks of the second read-write memory device comprises a plurality of pages, and wherein each virtual block comprises a plurality of pages of the plurality of pages of the actual blocks of the first read-write memory device or the plurality of pages of the actual blocks of the second read-write memory device;
dividing a boot loader into a first boot loader portion and a second boot loader portion based on the virtual block size, wherein the first boot loader portion and the second boot loader portion are different, wherein a size of the boot loader is greater than the virtual block size, and wherein the size of the boot loader is greater than one or both of the first size or the second size;
appending a virtual boundary code to the first boot loader portion, the virtual boundary code representing a marker for locating the first boot loader portion; and
storing the first boot loader portion with the virtual boundary code appended thereto in a virtual block of the series of virtual blocks on the first read-write memory device.

12. The computing device of claim 11, wherein the processor is configured with processor-executable instructions to perform operations such that the virtual boundary code is appended at the beginning of the first boot loader portion.

13. The computing device of claim 11, wherein the processor is configured with processor-executable instructions to perform operations such that both the first size and the second size are divisible by the virtual block size with no remainder.

14. The computing device of claim 11, wherein the processor is configured with processor-executable instructions to perform operations further comprising:
storing the second boot loader portion in another virtual block of the series of virtual blocks on the first read-write memory device.

15. The computing device of claim 14, wherein the processor is configured with processor-executable instructions to perform operations such that a bad block within the first read-write memory device is located between the first boot loader portion and the second boot loader portion.

16. The computing device of claim 14, wherein the processor is configured with processor-executable instructions to perform operations such that the first boot loader portion and the second boot loader portion are stored in a shared actual block of the series of actual blocks on the first read-write memory device.

17. The computing device of claim 11, wherein each virtual block includes the same virtual boundary code.

18. The computing device of claim 14, wherein the processor is configured with processor-executable instructions to perform operations such that the second boot loader portion includes an image header containing information regarding at least one of a position of the virtual boundary code on the first read-write memory device and the size of the boot loader.

19. The computing device of claim 14, wherein the processor is configured with processor-executable instructions to perform operations further comprising:
appending the virtual boundary code to a third boot loader portion; and
storing the third boot loader portion with the virtual boundary code appended thereto in a third virtual block of the series of virtual blocks.

20. The computing device of claim 11, wherein the processor is configured with processor-executable instructions to perform operations further comprising:
storing the first boot loader portion with the virtual boundary code appended thereto in a virtual block on the second read-write memory device, wherein at least one of a page size and a device-specific bad-block algorithm characteristic are different between the first read-write memory device and the second read-write memory device.

21. A computing device for storing a data image on a read-write memory device, the computing device comprising:
means for setting a virtual block size that is common for a series of virtual blocks designated for both a first read-write memory device and a second read-write memory device, wherein the virtual block size is based on a first size of each of a series of actual blocks of the first read-write memory device and a second size of each of a series of actual blocks of the second read-write memory device, wherein the first size and the second size are different, wherein each of the actual blocks of the first read-write memory device and each of the actual blocks of the second read-write memory device comprises a plurality of pages, and wherein each virtual block comprises a plurality of pages of the plurality of pages of the actual blocks of the first read-write memory device or the plurality of pages of the actual blocks of the second read-write memory device;

means for dividing a boot loader into a first boot loader portion and a second boot loader portion based on the virtual block size, wherein the first boot loader portion and the second boot loader portion are different, wherein a size of the boot loader is greater than the virtual block size, and wherein the size of the boot loader is greater than one or both of the first size or the second size;

means for appending a virtual boundary code to the first boot loader portion, the virtual boundary code representing a marker for locating the first boot loader portion; and means for storing the first boot loader portion with the virtual boundary code appended thereto in a virtual block of the series of virtual blocks on the first read-write memory device.

22. The computing device of claim 21, wherein the virtual boundary code is appended at the beginning of the first boot loader portion.

23. The computing device of claim 21, wherein both the first size and the second size are divisible by the virtual block size with no remainder.

24. The computing device of claim 21, further comprising:
means for storing the second boot loader portion in another virtual block of the series of virtual blocks on the first read-write memory device.

25. The computing device of claim 24, wherein a bad block within the first read-write memory device is located between the first boot loader portion and the second boot loader portion.

26. The computing device of claim 24, wherein the first boot loader portion and the second boot loader portion are stored in a shared actual block of the series of actual blocks on the first read-write memory device.

27. The computing device of claim 21, wherein each virtual block includes the same virtual boundary code.

28. The computing device of claim 24, wherein the second boot loader portion includes an image header containing information regarding at least one of a position of the virtual boundary code on the first read-write memory device and the size of the boot loader.

29. The computing device of claim 24, further comprising:
means for appending the virtual boundary code to a third boot loader portion; and
means for storing the third boot loader portion with the virtual boundary code appended thereto in a third virtual block of the series of virtual blocks.

30. The computing device of claim 21, further comprising:
means for storing the first boot loader portion with the virtual boundary code appended thereto in a virtual block on the second read-write memory device, wherein at least one of a page size and a device-specific bad-block algorithm characteristic are different between the first read-write memory device and the second read-write memory device.

31. A non-transitory computer readable storage medium having stored thereon processor-executable software instructions configured to cause a processor to perform operations for managing memory on a computing device having a memory, the operations comprising:
setting a virtual block size that is common for a series of virtual blocks designated for both a first read-write memory device and a second read-write memory device, wherein the virtual block size is based on a first size of each of a series of actual blocks of the first read-write memory device and a second size of each of a series of actual blocks of the second read-write memory device, wherein the first size and the second size are different, wherein each of the actual blocks of the first read-write memory device and each of the actual blocks of the second read-write memory device comprises a plurality of pages, and wherein each virtual block comprises a plurality of pages of the plurality of pages of the actual blocks of the first read-write memory device or the plurality of pages of the actual blocks of the second read-write memory device;
dividing a boot loader into a first boot loader portion and a second boot loader portion based on the virtual block size, wherein the first boot loader portion and the second boot loader portion are different, wherein a size of the boot loader is greater than the virtual block size, and wherein the size of the boot loader is greater than one or both of the first size or the second size;
appending a virtual boundary code to the first boot loader portion, the virtual boundary code representing a marker for locating the first boot loader portion; and
storing the first boot loader portion with the virtual boundary code appended thereto in a virtual block of the series of virtual blocks on the first read-write memory device.

32. The non-transitory computer readable storage medium of claim 31, wherein the stored processor-executable instructions are configured to cause a processor to perform operations such that the virtual boundary code is appended at the beginning of the first boot loader portion.

33. The non-transitory computer readable storage medium of claim 31, wherein the stored processor-executable instructions are configured to cause a processor to perform operations such that both the first size and the second size are divisible by the virtual block size with no remainder.

34. The non-transitory computer readable storage medium of claim 31, wherein the stored processor-executable software instructions are configured to cause a processor to perform operations further comprising:
storing the second boot loader portion in another virtual block of the series of virtual blocks on the first read-write memory device.

35. The non-transitory computer readable storage medium of claim 34, wherein the stored processor-executable instructions are configured to cause a processor to perform operations such that a bad block within the first read-write memory device is located between the first boot loader portion and the second boot loader portion.

36. The non-transitory computer readable storage medium of claim 34, wherein the stored processor-executable instructions are configured to cause a processor to perform operations such that the first boot loader portion and the second boot loader portion are stored in a shared actual block of the series of actual blocks on the first read-write memory device.

37. The non-transitory computer readable storage medium of claim 31, wherein each virtual block includes the same virtual boundary code.

38. The non-transitory computer readable storage medium of claim 34, wherein the stored processor-executable instructions are configured to cause a processor to perform operations such that the second boot loader portion includes an image header containing information regarding at least one of a position of the virtual boundary code on the first read-write memory device and the size of the boot loader.

39. The non-transitory computer readable storage medium of claim 34, wherein the stored processor-executable software instructions are configured to cause a processor to perform operations further comprising:
    appending the virtual boundary code to a third boot loader portion; and
    storing the third boot loader portion with the virtual boundary code appended thereto in a third virtual block of the series of virtual blocks.

40. The non-transitory computer readable storage medium of claim 31, wherein the stored processor-executable software instructions are configured to cause a processor to perform operations further comprising:
    storing the first boot loader portion with the virtual boundary code appended thereto in a virtual block on the second read-write memory device, wherein at least one of a page size and a device-specific bad-block algorithm characteristic are different between the first read-write memory device and the second read-write memory device.

41. A method of reading a data image from a read-write memory device, comprising:
    accessing a first portion of a first boot loader stored within a first virtual block of a first read-write memory device, a first actual block size of actual blocks of the first read-write memory device and a second actual block size of actual blocks of a second read-write memory device both being divisible by a virtual block size with no remainder, wherein the first actual block size and the second actual block size are different, and wherein each of the actual blocks of the first read-write memory device and each of the actual blocks of the second read-write memory device comprises a plurality of pages;
    scanning the first read-write memory device for a virtual boundary code designating a second virtual block boundary of a second virtual block following the first virtual block, wherein the first virtual block and the second virtual block each comprises a plurality of pages of the plurality of pages of the actual blocks of the first read-write memory device or the plurality of pages of the actual blocks of the second read-write memory device;
    accessing a second portion of the first boot loader stored within the second virtual block in response to recognizing the virtual boundary code in the second virtual block, wherein the first portion of the first boot loader is different than the second portion of the first boot loader, wherein a size of the first boot loader is greater than the virtual block size, and wherein the size of the boot loader is greater than one or both of the first actual block size or the second actual block size; and
    reading the first boot loader based on the first portion of the first boot loader and the second portion of the first boot loader.

42. The method of claim 41, further comprising:
    scanning the first read-write memory device for the virtual boundary code designating a third virtual block boundary of a third virtual block following the second virtual block in response to determining the first portion of the first boot loader and the second portion of the first boot loader do not include a complete image of the first boot loader;
    accessing a third portion of the first boot loader within the third virtual block in response to recognizing the virtual boundary code in the third virtual block; and
    reading the first boot loader further based on the third portion of the first boot loader.

43. The method of claim 41, further comprising executing the first boot loader.

44. The method of claim 41, further comprising:
    skipping an actual block of the actual blocks of the first read-write memory device following the first virtual block in response to the virtual boundary code not being detected in the actual block.

45. The method of claim 41, further comprising:
    skipping an intermediate distance on the first read-write memory device corresponding to a size of the first virtual block in response to the virtual boundary code not being detected in the intermediate distance.

46. The method of claim 45, further comprising:
    scanning header information contained in the first portion of the first boot loader within the first virtual block; and
    determining the size of at least one of the first boot loader and the virtual block size based on the header information.

47. The method of claim 41, further comprising:
    accessing a first portion of a second boot loader within a third virtual block of the second read-write memory device, wherein at least one of a page size and a device-specific bad-block algorithm characteristic are different between the first read-write memory device and the second read-write memory device;
    scanning the second read-write memory device for the virtual boundary code;
    accessing a second portion of the second boot loader within a fourth virtual block of the second read-write memory device in response to recognizing the virtual boundary code; and
    reading the second boot loader based on the first portion of the second boot loader and the second portion of the second boot loader.

48. A computing device, comprising:
    a memory; and
    a processor coupled to the memory and configured with processor-executable instructions to perform operations comprising:
        accessing a first portion of a first boot loader stored within a first virtual block of a first read-write memory device, a first actual block size of actual blocks of the first read-write memory device and a second actual block size of actual blocks of a second read-write memory device both being divisible by a virtual block size with no remainder, wherein the first actual block size and the second actual block size are different, and wherein each of the actual blocks of the first read-write memory device and each of the actual blocks of the second read-write memory device comprises a plurality of pages;

scanning the first read-write memory device for a virtual boundary code designating a second virtual block boundary of a second virtual block following the first virtual block, wherein the first virtual block and the second virtual block each comprises a plurality of pages of the plurality of pages of the actual blocks of the first read-write memory device or the plurality of pages of the actual blocks of the second read-write memory device;

accessing a second portion of the first boot loader stored within the second virtual block in response to recognizing the virtual boundary code in the second virtual block, wherein the first portion of the first boot loader is different than the second portion of the first boot loader, wherein a size of the first boot loader is greater than the virtual block size, and wherein the size of the boot loader is greater than one or both of the first actual block size or the second actual block size; and reading first the boot loader based on the first portion of the first boot loader and the second portion of the first boot loader.

49. The computing device of claim 48, wherein the processor is configured with processor-executable instructions to perform operations further comprising:

scanning the first read-write memory device for the virtual boundary code designating a third virtual block boundary of a third virtual block following the second virtual block in response to determining the first portion of the first boot loader and the second portion of the first boot loader do not include a complete image of the first boot loader;

accessing a third portion of the first boot loader within the third virtual block in response to recognizing the virtual boundary code in the third virtual block; and reading the first boot loader further based on the third portion of the first boot loader.

50. The computing device of claim 48, wherein the processor is configured with processor-executable instructions to perform operations further comprising executing the first boot loader.

51. The computing device of claim 48, wherein the processor is configured with processor-executable instructions to perform operations further comprising:

skipping an actual block of the actual blocks of the first read-write memory device following the first virtual block in response to the virtual boundary code not being detected in the actual block.

52. The computing device of claim 48, wherein the processor is configured with processor-executable instructions to perform operations further comprising:

skipping an intermediate distance on the first read-write memory device corresponding to a size of the first virtual block in response to the virtual boundary code not being detected in the intermediate distance.

53. The computing device of claim 52, wherein the processor is configured with processor-executable instructions to perform operations further comprising:

scanning header information contained in the first portion of the first boot loader within the first virtual block; and determining the size of at least one of the first boot loader and the virtual block size based on the header information.

54. The computing device of claim 48, wherein the processor is configured with processor-executable instructions to perform operations further comprising:

accessing a first portion of a second boot loader within a third virtual block of the second read-write memory device, wherein at least one of a page size and a device-specific bad-block algorithm characteristic are different between the first read-write memory device and the second read-write memory device;

scanning the second read-write memory device for the virtual boundary code;

accessing a second portion of the second boot loader within a fourth virtual block of the second read-write memory device in response to recognizing the virtual boundary code; and reading a second boot loader based on the first portion of the second boot loader and the second portion of the second boot loader.

55. A computing device for reading a data image from a read-write memory device, the computing device comprising:

means for accessing a first portion of a first boot loader stored within a first virtual block of a first read-write memory device, a first actual block size of actual blocks of the first read-write memory device and a second actual block size of actual blocks of a second read-write memory device both being divisible by a virtual block size with no remainder, wherein the first actual block size and the second actual block size are different, and wherein each of the actual blocks of the first read-write memory device and each of the actual blocks of the second read-write memory device comprises a plurality of pages;

means for scanning the first read-write memory device for a virtual boundary code designating a second virtual block boundary of a second virtual block following the first virtual block, wherein the first virtual block and the second virtual block each comprises a plurality of pages of the plurality of pages of the actual blocks of the first read-write memory device or the plurality of pages of the actual blocks of the second read-write memory device;

means for accessing a second portion of the first boot loader stored within the second virtual block in response to recognizing the virtual boundary code in the second virtual block, wherein the first portion of the first boot loader is different than the second portion of the first boot loader, wherein a size of the first boot loader is greater than the virtual block size, and wherein the size of the boot loader is greater than one or both of the first actual block size or the second actual block size; and means for reading the first boot loader based on the first portion of the first boot loader and the second portion of the first boot loader.

56. The computing device of claim 55, further comprising:

means for scanning the first read-write memory device for the virtual boundary code designating a third virtual block boundary of a third virtual block following the second virtual block in response to determining the first portion of the first boot loader and the second portion of the first boot loader do not include a complete image of the first boot loader;

means for accessing a third portion of the first boot loader within the third virtual block in response to recognizing the virtual boundary code in the third virtual block; and means for reading the first boot loader further based on the third portion of the first boot loader.

57. The computing device of claim 55, further comprising means for executing the first boot loader.

58. The computing device of claim 55, further comprising:
means for skipping an actual block of the actual blocks of the first read-write memory device following the first virtual block in response to the virtual boundary code not being detected in the actual block.

59. The computing device of claim 55, further comprising:
means for skipping an intermediate distance on the first read-write memory device corresponding to a size of the first virtual block in response to the virtual boundary code not being detected in the intermediate distance.

60. The computing device of claim 59, further comprising:
means for scanning header information contained in the first portion of the first boot loader within the first virtual block; and
means for determining the size of at least one of the first boot loader and the virtual block size based on the header information.

61. The computing device of claim 55, further comprising:
means for accessing a first portion of a second boot loader within a third virtual block of the second read-write memory device, wherein at least one of a page size and a device-specific bad-block algorithm characteristic are different between the first read-write memory device and the second read-write memory device;
means for scanning the second read-write memory device for the virtual boundary code;
means for accessing a second portion of the second boot loader within a fourth virtual block of the second read-write memory device in response to recognizing the virtual boundary code; and
means for reading a second boot loader based on the first portion of the second boot loader and the second portion of the second boot loader.

62. A non-transitory computer readable storage medium having stored thereon processor-executable software instructions configured to cause a processor to perform operations for reading memory on a computing device having a memory, the operations comprising:
accessing a first portion of a first boot loader stored within a first virtual block of a first read-write memory device, a first actual block size of actual blocks of the first read-write memory device and a second actual block size of actual blocks of a second read-write memory device both being divisible by a virtual block size with no remainder, wherein the first actual block size and the second actual block size are different, and wherein each of the actual blocks of the first read-write memory device and each of the actual blocks of the second read-write memory device comprises a plurality of pages;
scanning the first read-write memory device for a virtual boundary code designating a second virtual block boundary of a second virtual block following the first virtual block, wherein the first virtual block and the second virtual block each comprises a plurality of pages of the plurality of pages of the actual blocks of the first read-write memory device or the plurality of pages of the actual blocks of the second read-write memory device;
accessing a second portion of the first boot loader stored within the second virtual block in response to recognizing the virtual boundary code in the second virtual block, wherein the first portion of the first boot loader is different than the second portion of the first boot loader, wherein a size of the first boot loader is greater than the virtual block size, and wherein the size of the boot loader is greater than one or both of the first actual block size or the second actual block size; and
reading the first boot loader based on the first portion of the first boot loader and the second portion of the first boot loader.

63. The non-transitory computer readable storage medium of claim 62, wherein the stored processor-executable software instructions are configured to cause a processor to perform operations further comprising:
scanning the first read-write memory device for the virtual boundary code designating a third virtual block boundary of a third virtual block following the second virtual block in response to determining the first portion of the first boot loader and the second portion of the first boot loader do not include a complete image of the first boot loader;
accessing a third portion of the first boot loader within the third virtual block in response to recognizing the virtual boundary code in the third virtual block; and
reading the first boot loader further based on the third portion of the first boot loader.

64. The non-transitory computer readable storage medium of claim 62, wherein the stored processor-executable software instructions are configured to cause a processor to perform operations further comprising executing the first boot loader.

65. The non-transitory computer readable storage medium of claim 62, wherein the stored processor-executable software instructions are configured to cause a processor to perform operations further comprising:
skipping an actual block of the actual blocks of the first read-write memory device following the first virtual block in response to the virtual boundary code not being detected in the actual block.

66. The non-transitory computer readable storage medium of claim 62, wherein the stored processor-executable software instructions are configured to cause a processor to perform operations further comprising:
skipping an intermediate distance on the first read-write memory device corresponding to a size of the first virtual block in response to the virtual boundary code not being detected in the intermediate distance.

67. The non-transitory computer readable storage medium of claim 66, wherein the stored processor-executable software instructions are configured to cause a processor to perform operations further comprising:
scanning header information contained in the first portion of the first boot loader within the first virtual block; and
determining the size of at least one of the first boot loader and the virtual block size based on the header information.

68. The non-transitory computer readable storage medium of claim 62, wherein the stored processor-executable software instructions are configured to cause a processor to perform operations further comprising:
accessing a first portion of a second boot loader within a third virtual block of the second read-write memory device, wherein at least one of a page size and a device-specific bad-block algorithm characteristic are different between the first read-write memory device and the second read-write memory device;

scanning the second read-write memory device for the virtual boundary code;

accessing a second portion of the second boot loader within a fourth virtual block of the second read-write memory device in response to recognizing the virtual boundary code; and reading the second boot loader based on the first portion of the second boot loader and the second portion of the second boot loader.

* * * * *